United States Patent
Sherry (10) Patent No.: US 9,606,143 B1
(45) Date of Patent: Mar. 28, 2017

(54) ELECTRICALLY CONDUCTIVE PINS FOR LOAD BOARDS LACKING KELVIN CAPABILITY FOR MICROCIRCUIT TESTING

(71) Applicant: Johnstech International Corporation, Minneapolis, MN (US)

(72) Inventor: Jeffrey C. Sherry, Savage, MN (US)

(73) Assignee: Johnstech International Corporation, Minneapolis, MN (US)

( * ) Notice: Subject to any disclaimer, the term of this patent is extended or adjusted under 35 U.S.C. 154(b) by 318 days.

(21) Appl. No.: 14/329,057

(22) Filed: Jul. 11, 2014

Related U.S. Application Data (60) Provisional application No. 61/844,951, filed on Jul. 11, 2013.

(51) Int. Cl.
*G01R 1/067* (2006.01)
*G01R 3/00* (2006.01)

(52) U.S. Cl.
CPC .............. *G01R 1/067* (2013.01); *G01R 3/00* (2013.01)

(58) Field of Classification Search
None
See application file for complete search history.

(56) References Cited

U.S. PATENT DOCUMENTS

| | | | | |
|---|---|---|---|---|
| 6,293,814 B1* | 9/2001 | Tan | ...................... | G01R 1/0433 439/188 |
| 6,788,080 B1* | 9/2004 | Lenz | .................. | G01R 1/07342 324/754.05 |
| 7,271,606 B1* | 9/2007 | Tang | .................. | G01R 1/06738 324/715 |
| 2002/0084795 A1* | 7/2002 | Cook | ................. | G01R 31/2844 324/754.05 |
| 2007/0229104 A1* | 10/2007 | Weiss | ..................... | G01R 27/14 324/754.05 |

\* cited by examiner

*Primary Examiner* — Melissa Koval
*Assistant Examiner* — Felicia Farrow
(74) *Attorney, Agent, or Firm* — Altera Law Group, LLC (57) ABSTRACT

A device under test (DUT) has terminals connected to electrically conductive contacts which are in turn connect to a load board and to a test signal source. A second set of kelvin terminals are likewise connected to the DUT, but by pass the load board for connection to a test signal source. The kelvin terminals extend distally away from the DUT and are bonded to a flex circuit at their distal ends so that they make electrical and mechanical contact with the flex circuit. An intermediary terminal block receives the flex circuit and a ribbon cable or other wire connects to a test signal source. The entire circuit then circumvents the use of the load board.

7 Claims, 8 Drawing Sheets

ELECTRICALLY CONDUCTIVE PINS FOR LOAD BOARDS LACKING KELVIN CAPABILITY FOR MICROCIRCUIT TESTING

CROSS REFERENCE TO RELATED APPLICATIONS

This application claims priority from the pending patent application Ser. No. 13/651,116 filed 12 Oct. 2012 and published as US-2013/0099810-A1, Ser. No. 13/276,893 filed 19 Oct. 2011 and published as US-2012/0092034-A1, Ser. No. 12/764,603 filed 21 Apr. 2011 and PCT Patent Application PCT/US2010/031896 and published as WO/2010/123991 all entitled Improved Electrically Conductive Kelvin Contacts For Microcircuit Tester and all of common ownership and further are all hereby incorporated by reference along with all applications from which they claim priority.

BACKGROUND

Field of the Invention

The present disclosure is directed to equipment for testing microcircuits.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment plate or board aligns the microcircuit itself with the test contacts. Many times the alignment plate is separate from the housing that houses the contacts because it tends to wear and need replacing more often. The test housing and the alignment plate are mounted on a load board having conductive pads that make electrical connection to the test contacts. The load board pads are connected to circuit paths that carry the test signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive contacts arranged in a pattern that corresponds to both the terminals on the device under test and the electrical pads on the load board. When the device under test is forced into contact with the tester, the contacts complete the circuits between respective device under test contacts and corresponding load board pads. After testing, when the device under test is released, the terminals separate from the contacts and the circuits are broken.

The present application is directed to improvements to these contacts.

There is a type of testing known as "Kelvin" testing, which accurately measures the resistance between two terminals on the device under test. Basically, Kelvin testing involves forcing a current to flow between the two terminals, measuring the voltage difference between the two terminals, and using Ohm's Law to derive the resistance between the terminals, given as the voltage divided by the current. Each terminal on the device under test is electrically connected to two contacts and their associated pads on the load board. One of the two pads supplies a known amount of current. The other pad, known as the "sense" connection, is a high-impedance connection that acts as a voltmeter, which does not draw any significant amount of current. In other words, each terminal on the device under test that is to undergo Kelvin testing is simultaneously electrically connected to two pads on the load board—one pad supplying a known amount of current and the other pad measuring a voltage and drawing an insignificant amount of current while doing so. The terminals are Kelvin tested two at a time, so that a single resistance measurement uses two terminals on the load board and four contact pads.

In this application, the contacts that form the temporary electrical connections between the device under test and the load board may be used in several manners. In a "standard" test, each contact connects a particular terminal on the device under test to a particular pad on the load board, with the terminals and pads being in a one-to-one relationship. For these standard tests, each terminal corresponds to exactly one pad, and each pad corresponds to exactly one terminal. In a "Kelvin" test, there are two contacts contacting each terminal on the device under test, as described above. For these Kelvin tests, each terminal on the device under test corresponds to two pads on the load board, and each pad on the load board corresponds to exactly one terminal on the device under test. Although the testing scheme may vary, the mechanical structure and use of the contacts is essentially the same, regardless of the testing scheme.

There are many aspects of the testbeds that may be incorporated from older or existing testbeds. For instance, much of the mechanical infrastructure and electrical circuitry may be used from existing test systems, and may be compatible with the electrically conductive contacts disclosed herein. Such existing systems are listed and summarized below.

An exemplary microcircuit tester is disclosed in United States Patent Application Publication Number US 2007/0202714 A1, titled "Test contact system for testing integrated circuits with packages having an array of signal and power contacts", invented by Jeffrey C. Sherry, published on Aug. 30, 2007 and incorporated by reference herein in its entirety.

For the tester of '714, a series of microcircuits is tested sequentially, with each microcircuit, or "device under test", being attached to a testbed, tested electrically, and then removed from the testbed. The mechanical and electrical aspects of such a testbed are generally automated, so that the throughput of the testbed may be kept as high as possible.

In '714, a test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal. Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

In '714, a plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slots separating fingers could be plated to create an I-beam, thereby preventing fingers from deforming, and also increasing life.

The connection vias of '714 may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes of '714 may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

In '714, the device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O. The device I/O may be physically close to the load board, thus improving electrical performance.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer projects a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.25 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test contact arrangement has short signal paths.

Third, solders commonly in use today for device terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

BGA test contacts currently known and used in the art employ spring contacts made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. US 2004/0201390 A1, titled "Test interconnect for bumped semiconductor components and method of fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches topography of the bumped contacts. The leads can be formed by forming a patterned metal layer on the substrate, by attaching a polymer substrate with the leads thereon to the substrate, or by etching the substrate to form conductive beams.

According to U.S. Pat. No. 6,246,249 B1, titled "Semiconductor inspection apparatus and inspection method using the apparatus" and issued on Jun. 12, 2001 to Fukasawa, et al., a semiconductor inspection apparatus performs a test on a to-be-inspected device which has a spherical connection terminal. This apparatus includes a conductor layer formed on a supporting film. The conductor layer has a connection portion. The spherical connection terminal is connected to the connection portion. At least a shape of the connection portion is changeable. The apparatus further includes a shock absorbing member, made of an elastically deformable and insulating material, for at least supporting the connection portion. A test contact element of the invention for making temporary electrical contact with a microcircuit terminal comprises at least one resilient finger projecting from an insulating contact membrane as a cantilevered beam. The finger has on a contact side thereof, a conducting contact pad for contacting the microcircuit terminal.

In U.S. Pat. No. 5,812,378, titled "Microelectronic connector for engaging bump leads" and issued on Sep. 22, 1998 to Fjelstad, et al., a connector for microelectronic includes a sheet-like body having a plurality of holes, desirably arranged in a regular grid pattern. Each hole is provided with a resilient laminar contact such as a ring of a sheet metal having a plurality of projections extending inwardly over the hole of a first major surface of the body. Terminals on a second surface of the connector body are electrically connected to the contacts. The connector can be attached to a substrate such a multi-layer circuit panel so that the terminals on the connector are electrically connected to the leads within the substrate. Microelectronic elements having bump leads thereon may be engaged with the connector and hence connected to the substrate, by advancing the bump leads into the holes of the connector to engage the bump leads with the contacts. The assembly can be tested, and if found acceptable, the bump leads can be permanently bonded to the contacts.

According to United States Patent Application Publication No. US 2001/0011907 A1, titled "Test interconnect for bumped semiconductor components and method of fabrication" and published on Aug. 9, 2001, an interconnect for testing semiconductor components includes a substrate, and contacts on the substrate for making temporary electrical connections with bumped contacts on the components. Each contact includes a recess and a support member over the recess configured to electrically engage a bumped contact. The support member is suspended over the recess on spiral leads formed on a surface of the substrate. The spiral leads allow the support member to move in a z-direction within the recess to accommodate variations in the height and planarity of the bumped contacts. In addition, the spiral leads twist the support member relative to the bumped contact to facilitate penetration of oxide layers thereon. The spiral leads can be formed by attaching a polymer substrate with the leads thereon to the substrate, or by forming a patterned metal layer on the substrate. In an alternate embodiment contact, the support member is suspended over the surface of the substrate on raised spring segment leads.

Consider an electrical chip that is manufactured to be incorporated into a larger system. When in use, the chip electrically connects the device to the larger system by a series of contacts or terminals. For instance, the contacts on the electrical chip may plug into corresponding sockets in a computer, so that the computer circuitry may electrically connect with the chip circuitry in a predetermined manner. An example of such a chip may be a memory card or processor for a computer, each of which may be insertable into a particular slot or socket that makes one or more electrical connections with the chip.

It is highly desirable to test these chips before they are shipped, or before they are installed into other systems. Such component-level testing may help diagnose problems in the manufacturing process, and may help improve system-level yields for systems that incorporate the chips. Therefore, sophisticated test systems have been developed to ensure that the circuitry in the chip performs as designed. The chip is attached to the tester, as a "device under test", is tested, and is then detached from the tester. In general, it is desirable to perform the attachment, testing, and detachment as rapidly as possible, so that the throughput of the tester may be as high as possible.

The test systems access the chip circuitry through the same contacts or terminals that will later be used to connect the chip in its final application. As a result, there are some general requirements for the test system that perform the testing. In general, the tester should establish electrical contact with the various contacts or terminals so that the contacts are not damaged, and so that a reliable electrical connection is made with each contact.

Most testers of this type use mechanical contacts between the chip I/O contacts and the tester contacts, rather than soldering and de-soldering or some other attachment method. When the chip is attached to the tester, each contact on the chip is brought into mechanical and electrical contact with a corresponding pad on the tester. After testing, the chip is removed from the tester, and the mechanical and electrical contacts are broken.

In general, it is highly desirable that the chip and the tester both undergo as little damage as possible during the attachment, testing, and detachment procedures. Pad layouts on the tester may be designed to reduce or minimize wear or damage to the chip contacts. For instance, it is not desirable to scrape the device I/O (leads, contacts, pads or balls), bend or deflect the I/O, or perform any operation that might permanently change or damage the I/O in any way. Typically, the testers are designed to leave the chips in a final state that resembles the initial state as closely as possible. In addition, it is also desirable to avoid or reduce any permanent damage to the tester or tester pads, so that tester parts may last longer before replacement.

There is currently a great deal of effort spent by tester manufacturers on the pad layouts. For instance, the pads may include a spring-load mechanism that receives the chip contacts with a prescribed resisting force. In some applications, the pads may have an optional hard stop at the extreme end of the spring-load force range of travel. The goal of the pad layout is to establish a reliable electrical connection with the corresponding chip contacts, which may be as close as possible to a "closed" circuit when the chip is attached, and may be as close as possible to an "open" circuit when the chip is detached.

Because it is desirable to test these chips as quickly as possible, or simulate their actual use in a larger system, it may be necessary to drive and/or receive electrical signals from the contacts at very high frequencies. The test frequencies of current-day testers may be up to 40 GHz or more, and the test frequencies are likely to increase with future generation testers.

For low-frequency testing, such as done close to DC (0 Hz), the electrical performance may be handled rather simplistically: one would want an infinitely high resistance when the chip is detached, and an infinitesimally small resistance when the chip is attached.

At higher frequencies, other electrical properties come into play, beyond just resistance. Impedance (or, basically, resistance as a function of frequency) becomes a more proper measure of electrical performance at these higher frequencies. Impedance may include phase effects as well as amplitude effects, and can also incorporate and mathematically describe the effects of resistance, capacitance and inductance in the electrical path. In general, it is desirable that the contact resistance in the electrical path formed between the chip I/O and the corresponding pad on the load card be sufficiently low, which maintains a target impedance of 50 ohms, so that the tester itself does not significantly distort the electrical performance of the chip under test. Note that most test equipment is designed to have 50 ohm input and output impedances.

For modern-day chips that have many, many closely spaced I/O, it becomes helpful to simulate the electrical and mechanical performance at the device I/O interface. Finite-element modeling in two- or three dimensions has become a tool of choice for many designers. In some applications, once a basic geometry style has been chosen for the tester pad configuration, the electrical performance of the pad configuration is simulated, and then the specific sizes and shapes may be iteratively tweaked until a desired electrical performance is achieved. For these applications, the mechanical performance may be determined almost as an afterthought, once the simulated electrical performance has reached a particular threshold.

BRIEF SUMMARY

For the purposes of helping the reader in understanding some of the elements of this disclosure, the following summary is provided. Note that this summary does not define the scope of the invention. That is found in the claims.

There is disclosed a kelvin test device for testing a device under test (DUT) having some or all of the following elements.

a. first and second temporary mechanical and electrical contacts between the DUT having a plurality of terminals, the first electrical contacts engaging the terminals at their proximal end and being routed to a load board at their distal ends; for sending and receiving test signals from a test signal source. The first contacts would normally be routed to the load board and the board would normally be designed for that purpose.

b. the second contacts being kelvin test contacts, could be a "retrofit" i.e., to be added to the test system after the load board had been made for non-kelvin testing. These contacts will also be in temporary mechanical and electrical contact with said DUT at their proximal ends and being routed to said signal source without interconnection with said load board at their distal ends. That means that the pathway of these second kelvin contacts cannot use the load board pathway because it was not designed for this purpose. Instead the second contact, include:

i. a flex circuit having electrical traces;
  ii. a portion of said second contacts toward said distal end being overlaid, and electrically connected, such as by bonding to said flex circuit at one end;
  iii. a connection block/terminal/box or equivalent having a receiver (such as a socket) for an end of said flex circuit and being wired to said signal source without passing through said load board;
  iv. the remaining end of the said flex circuit being electrically and mechanically connected to said connection block, preferably following a planar path from the second contacts to the connection block;

whereby the kelvin contacts are connected to the signal source without passing through said load board.

Also disclosed is a method of retrofitting a test system for testing a device under test (DUT), said test system being connected to a load board lacking pads for kelvin contacts on the load board, the test system having a kelvin test contacts with their proximal ends at the DUT and their distal ends extending away from the DUT, comprising any of the following steps in any order:

a. extending the kelvin contacts longitudinally away from the DUT;
b. physically and electrically bonding a flex circuit having traces corresponding to kelvin test contact to the kelvin contacts and proximate the distal end thereof;
c. inserting the remaining end of the flex circuit into a contact block and;
d. connecting an output of the contact block to a extending a flex circuit from the contact block a ribbon cable;
e. connecting the cable, such as a ribbon cable, to a test signal source, without contacting the load board; or by locating a place on the load board
which was otherwise vacant and connecting through that area on the load board.
thereby retrofitting the test system to include kelvin capabilities.

It is to be understood that this disclosure, includes the capability to use a load board which was not built for kelvin circuits. That is, kelvin contacts were not contemplated when the load board was designed. Rather than build an entirely new and expensive load board, this disclosure teaches, amongst other things, how to route kelvin signals to a vacant place on the load board, or circumventing the load board entirely thereby providing a retrofit to load boards which were not built with kelvin in mind.

DETAILED DESCRIPTION

A general summary of the disclosure follows.

The terminals of a device under test are temporarily electrically connected to corresponding contact pads on a load board by a series of electrically conductive contacts. The terminals may be pads, balls, wires (leads) or other contact points. Each terminal that undergoes Kelvin testing connects with both a "force" contact and a "sense" contact, with each contact electrically connecting to a respective, single contact pad on the load board. The force contact delivers a known amount of current to or from the terminal, and the sense contact measures a voltage at the terminal and draws a negligible amount of current to or from the terminal. The sense contact partially or completely laterally surrounds the force contact, so that it need not have its own resiliency, though it may also be resilient in its own right. This helps keep the force contact in alignment by preventing lateral wobbling. In a first case, the sense contact has a forked end with prongs that extend to opposite sides of the force contact. In a second case, the sense contact completely laterally surrounds the force contact and slides horizontally/laterally to match a horizontal translation component of a horizontal cross-section of the force contact during vertical compression of the force contact. In a third case, the sense contact includes two rods that have ends on opposite sides of the force contact, and extend parallel and laterally away from the force contact. In these cases, the sense contact extends horizontally along a membrane or housing that supports the force contacts. The rods may be housed in respective channels along the membrane or in the housing. While the kelvin feature described above is very effective in improving the throughput and reliability of DUT testing, it is difficult to retrofit existing load boards to include the kelvin feature because the load board must be modified to accommodate the distal end (distant from the DUT) of extensions from the contacts on the board. For purposes of this disclosure, we define a load board which has not been designed with pads for kelvin contacts to be non-compliant or incompatible with Kelvin contacts. In other words, a load board which was not designed initially to work with Kelvin technology and which require modification or replacement to be compatible. Since modification is expensive or impossible without replacement, users may object to the additional cost of modification/replacement of the load board.

Therefore a solution to that problem of noncompliance is set forth herein which routes the kelvin conductors away from the load board to flex circuits or other paths which can interconnect directly to the circuitry behind the load board, or to an unused area on the load board. This makes it possible for an existing (non-kelvin compliant) test system to be retrofit for kelvin capability but without expensive modifications.

In addition to kelvin technology, it may be desirable to monitor other parameters adjacent the DUT, such as heat, humidity etc. Like kelvin circuits, these additional parameters require probes with a path back to a test signal source, via the load board. (A test signal source is defined as a source of power and/or signals transmitted and/or received from the DUT or, kelvin or other sensor probes). The disclosure herein provides an alternative for such probes without using the load board path.

The preceding paragraph is merely a summary of the disclosure, and should not be construed as limiting in any way. The test device is described in much greater detail below.

Figure 1:
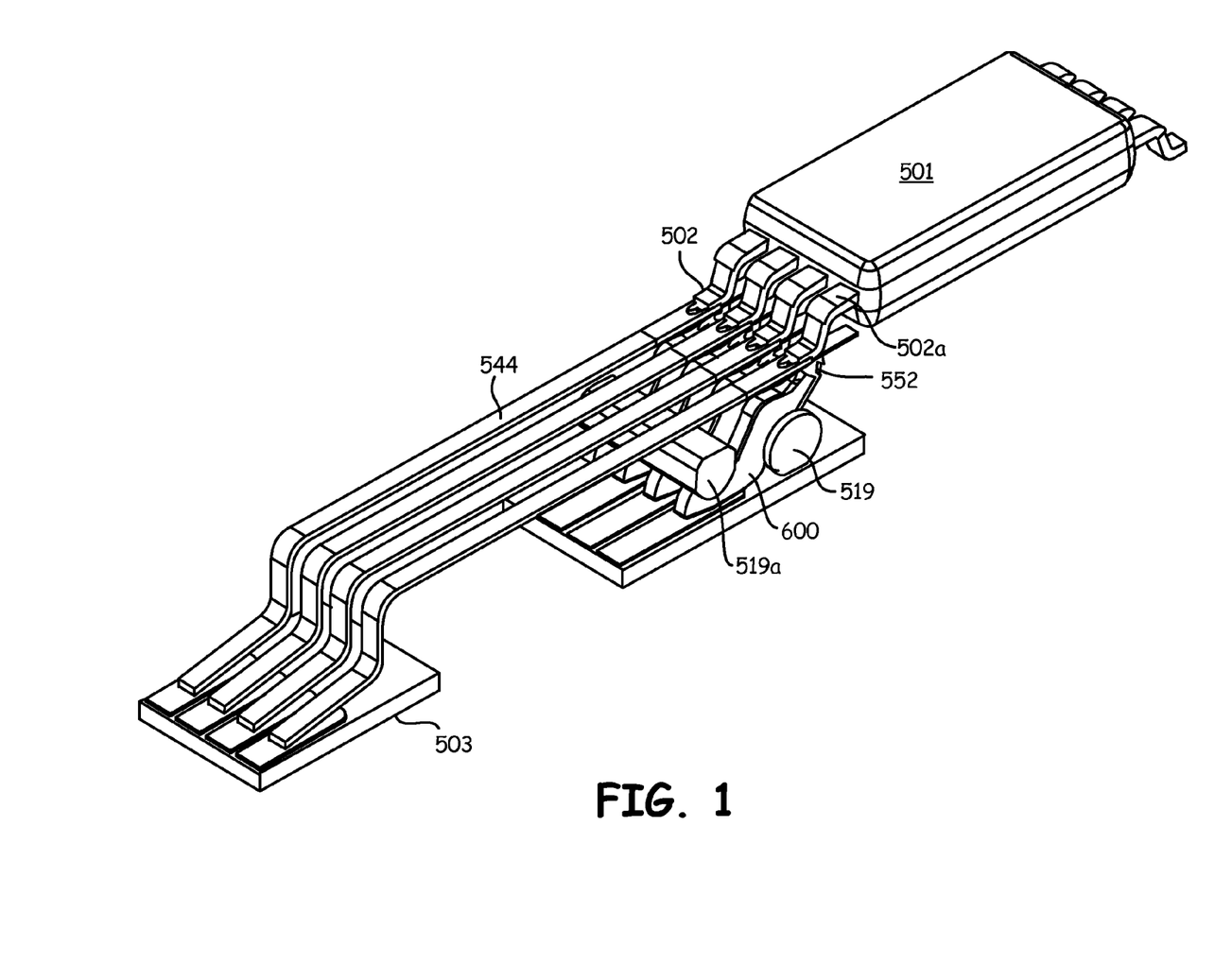
FIG. 1 is a perspective schematic view of a leaded integrated circuit package and the Kelvin contact system therefore without the load board compliant kelvin capability shown.

FIG. 1 shows a leaded device (DUT) 501 with a plurality of leads 502a each having contacts 502. As in the case of pad packages, a force contact 552 makes contact with a lead 502, usually in a central portion thereof. Contact 552 is upwardly biased by element 519. A second bias block 519a is used to apply a downward force on the rocking pin 600. Rocking pin 600 is similar to that shown in U.S. Pat. Nos. 5,069,629 and 7,445,465 and is hereby incorporated by reference.

Contact extensions 544 are formed so that they follow a path to a load board 503, where they make electrical contact. The extension is helpful in reaching available unused areas of the load board layout and facilitates easier trace routing on the load board but ultimately it requires that the kelvin signals be contact to a pad on the load board.

Figure 2:
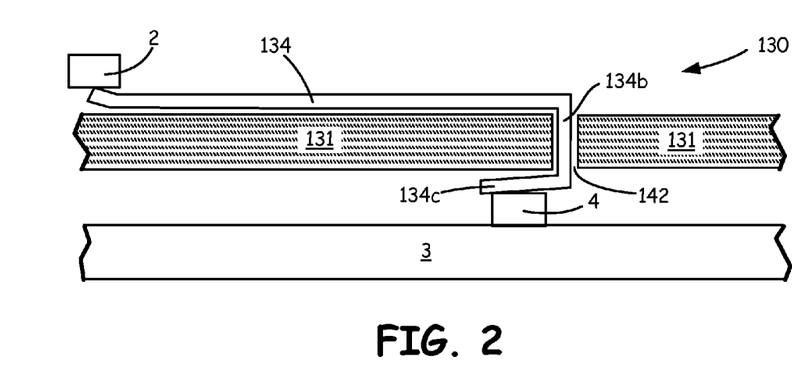
FIG. 2 is a side-view cross-sectional drawing of a sample geometry of a sense (voltage) contact in its path from the terminal on the device under test to the contact pad on the load board without the load board compliant kelvin capability shown.

FIG. 2 is side-view cross-sectional drawing of a design 130, showing a sample geometry of a sense (voltage) contact 134 in its path from the terminal 2 on the device under test to the contact pad 4 on the load board 3 which has a plurality of apertures 142 of predetermined gap therein.

The contact 134 extends laterally away from the terminal 2 along a face of the housing 131, bends roughly 90 degrees (orthogonal) to extend through a hole in the housing 131, (portion 134b) and bends (portion 134c) generally equal to or preferably slightly less than 90 degrees to lie roughly parallel to the opposing face of the housing 131 through aperture 142. This generally equal to or preferably less than 90 degree bend provides some bias force to the load board pad 4 assuring a solid connection. When contacting the electrical contact pad 4 on the load board 3, a portion of the contact 134 is longitudinally disposed between the contact pad 4 and the housing 131. Aperture 142 is sized to be greater than the thickness of the portion of the contact passing there through. In the preferred embodiment, the aperture is rectangular or the same shape as the contact passing through, and the gap created between the contact portion 134b and the walls of the aperture should be sufficiently great a turning force (lever action) can be transmitted from the force applied on contact 134c/d by pad 4 (or 2) to contact 134 on pad 2 (or 4). Thus, the gap is wide enough to control the position of the contact through the aperture but still transmit such force. Typically an aperture of twice or three times the thickness of the contact portion will suffice.

In the specific design 130 of FIG. 2, both ends of the contact 134, are bent toward the terminal 2 on the device under test. There are alternatives to this geometry.

Figure 3:
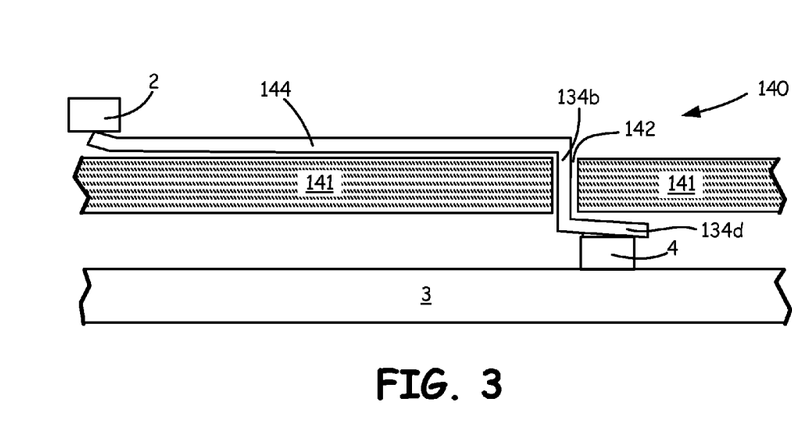
FIG. 3 is a side-view cross-sectional drawing of another sample geometry of a sense (voltage) contact in its path from the terminal on the device under test to the contact pad on the load board without the load board compliant kelvin capability shown.

For instance, FIG. 3 shows a design 140 similar to design 130, in which the contact 144 extends laterally away from the terminal 2 along a face of the housing 141, bends 90 degrees (portion 134b) to pass through a hole 142 in the housing 141, and bends (portion 134d) roughly equal to or preferably slightly less than 90 degrees to lie roughly parallel to the opposing face of the housing 141. This generally equal to or preferably less than 90 degree bend provides some bias force to the load board pad 4 assuring a solid connection. In contrast with the design 130 of FIG. 2, the design 140 of FIG. 3 has opposite ends of the contact 144 extending in opposite directions, rather than both ends extending toward the terminal 2

In both FIGS. 2 and 3 contacts 134c/d must have a corresponding pad 4 on the load board.

FIGS. 4-9 illustrate embodiments which circumvent this limitation.

Figure 7:
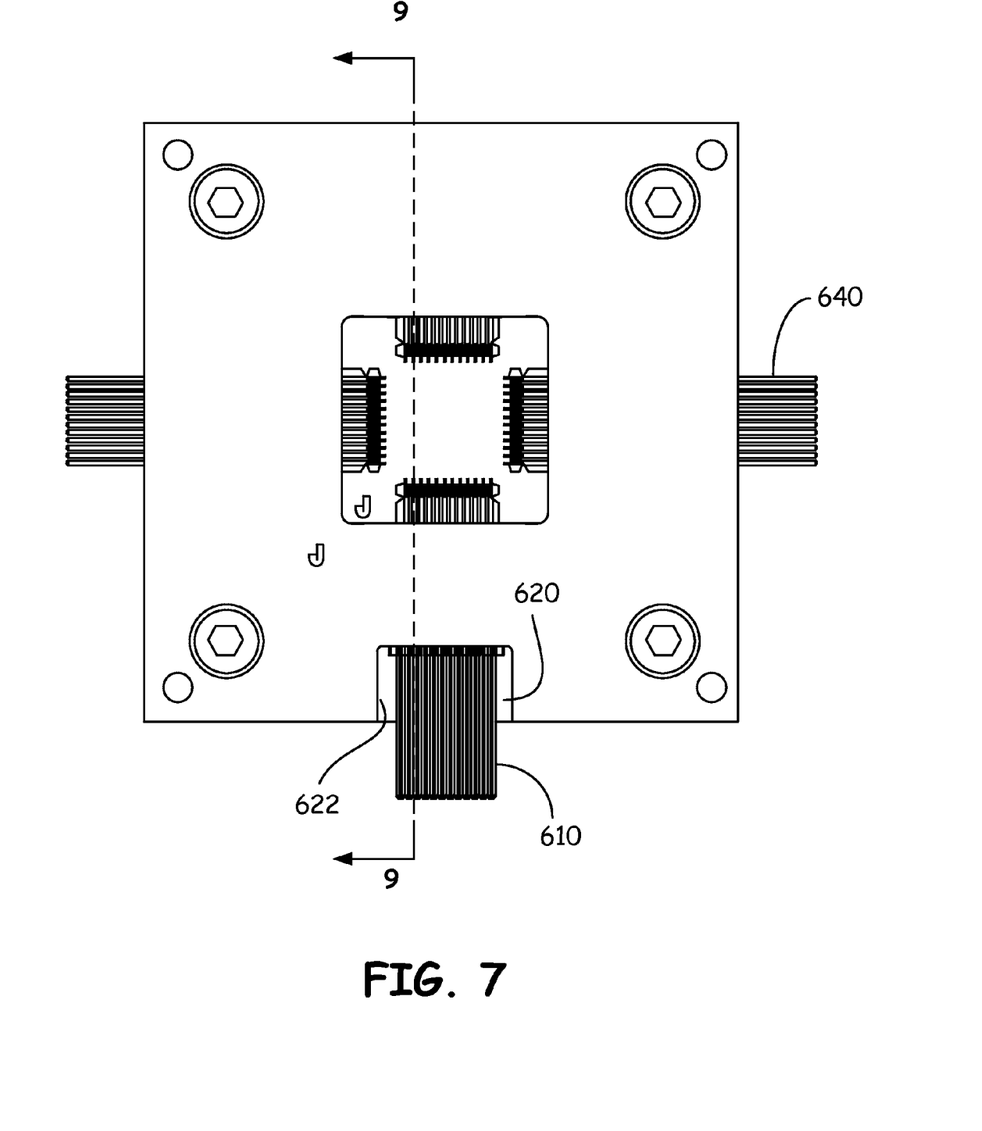
FIG. 7 is a top plan view of FIG. 6.
Figure 8:
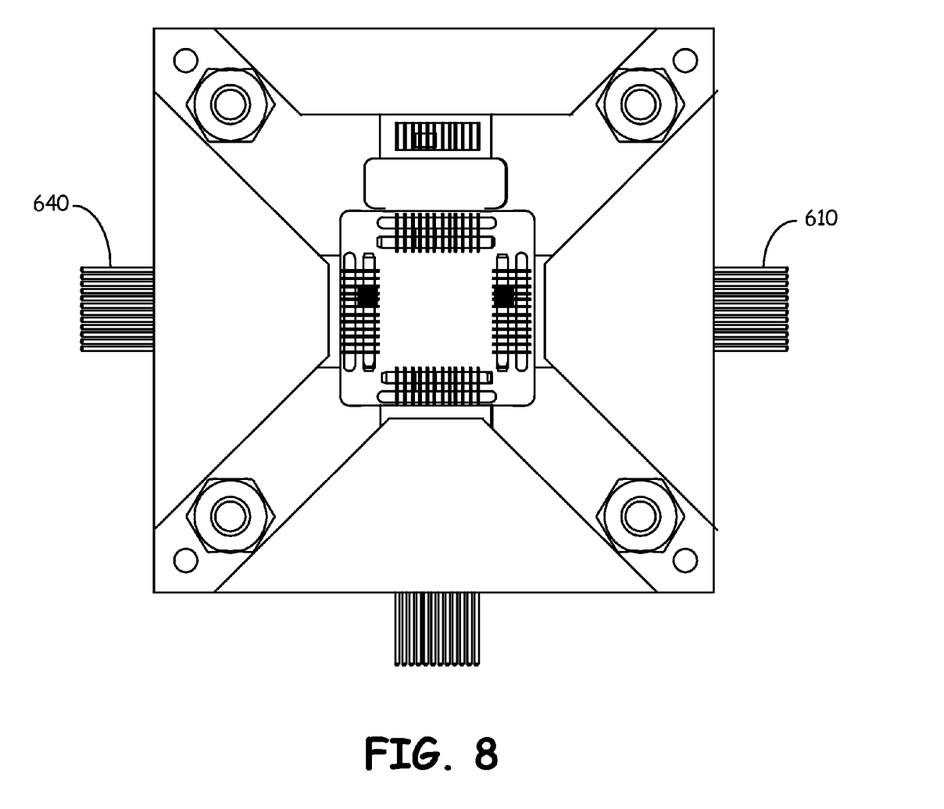
FIG. 8 is a bottom plan view of FIG. 6.
Figure 9:
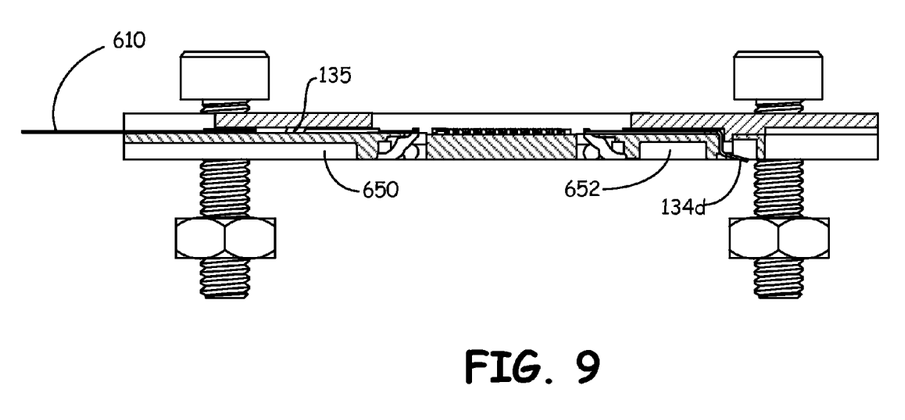
FIG. 9 is a side plan view of a kelvin structure, with the left side being load board compliant and the right side conforming to FIGS. 1 and 3.

FIG. 9 shows a direct comparison between the structure of FIGS. 2-3 and FIGS. 4-8. In FIG. 9, contact 134d requires a contact pad on the load board (not shown) whereas flex circuit 135 does not. FIG. 9 also shows the relative size of decoupling areas 650 and 652. Because of the elimination of space for contact 134d, the void area 650 can be made much larger. This void is a cut away portion between the load board and the alignment plate. This area is needed for decoupling/filter circuits on the load board.

Figure 4:
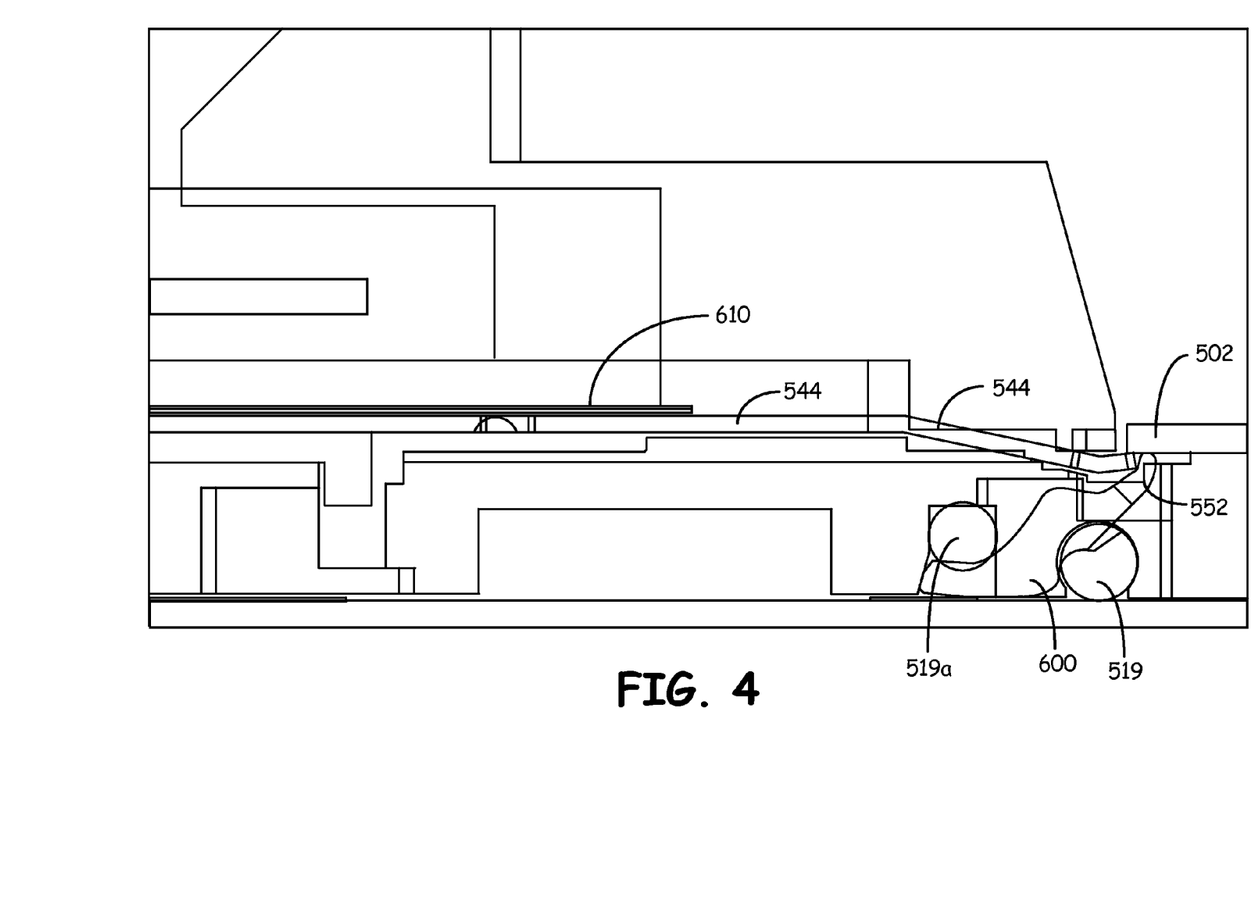
FIG. 4 is a side plan view of an alternative embodiment with load board compliant capability shown.

In FIG. 4, the kelvin contacts (sense and force) lead to contact extensions 544 which are either over laid or under laid by a flex circuit 610. In FIG. 4, the flex circuit sits atop the contact extensions. Therefore, the contact extensions are collinearly aligned with exposed trace surfaces on the flex circuit so that a contact trace on the flex circuit abuts an electrode from the kelvin contact. Note that the term "flex circuit" is intended to be interpreted broadly as any wire or trace on an insulation or substrate.

Figure 5:
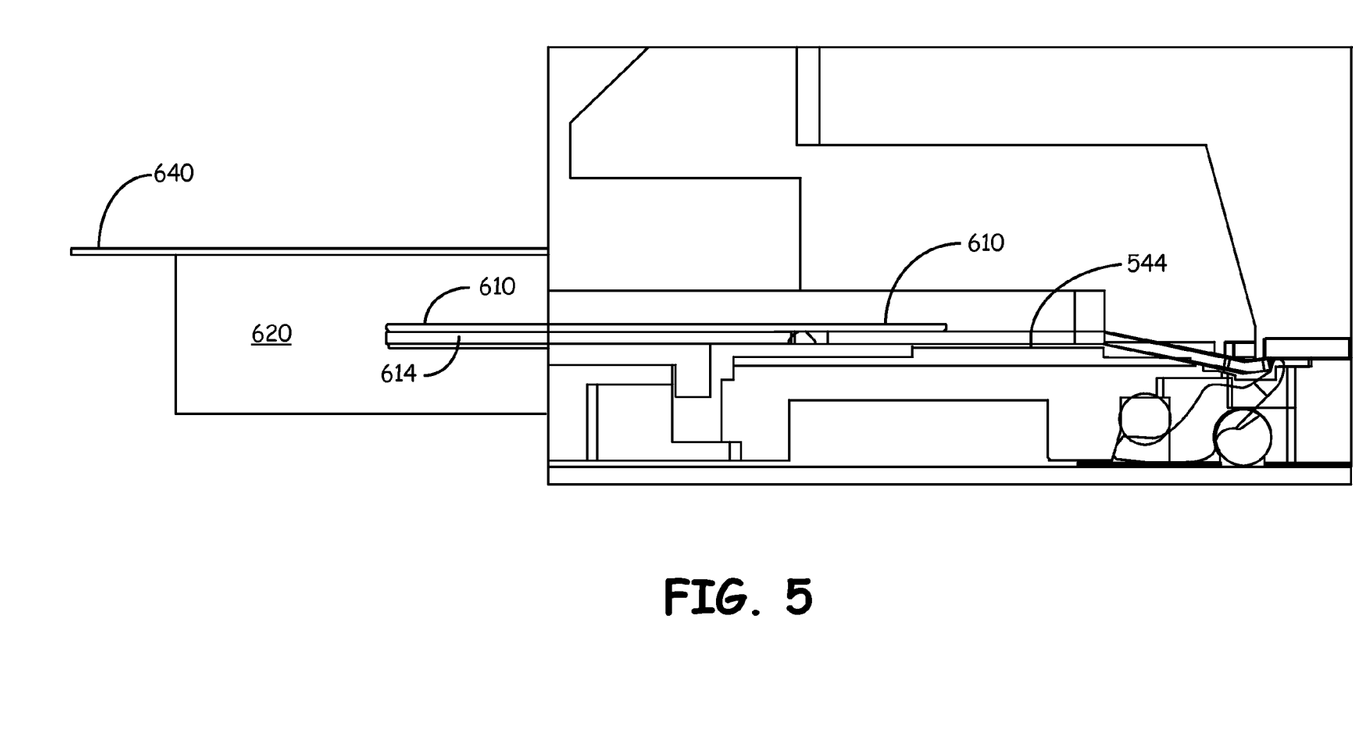
FIG. 5 is a view like FIG. 4 with the kelvin circuit extending into a contact block for connection to a load board.

An alternate embodiment is shown in FIG. 5 where the flex circuit 610 terminates within a contact block 620 which receives the flex circuit line a socket for a plug with the flex circuit being the plug element. The flex circuit may also be reinforced by a rigid or semi-rigid support member 614 or the flex circuit may have solder flow at its distal end to enhance contact in block 620. Connector block 620 may then have a further conductor or flex circuit or ribbon cable 640 which carries the signals to a signal source, or an unoccupied area of the load board. Connector blocks are widely available such as Digi-Key Corporation, Thief River Falls, Minn. 56701 USA.

Figure 6:
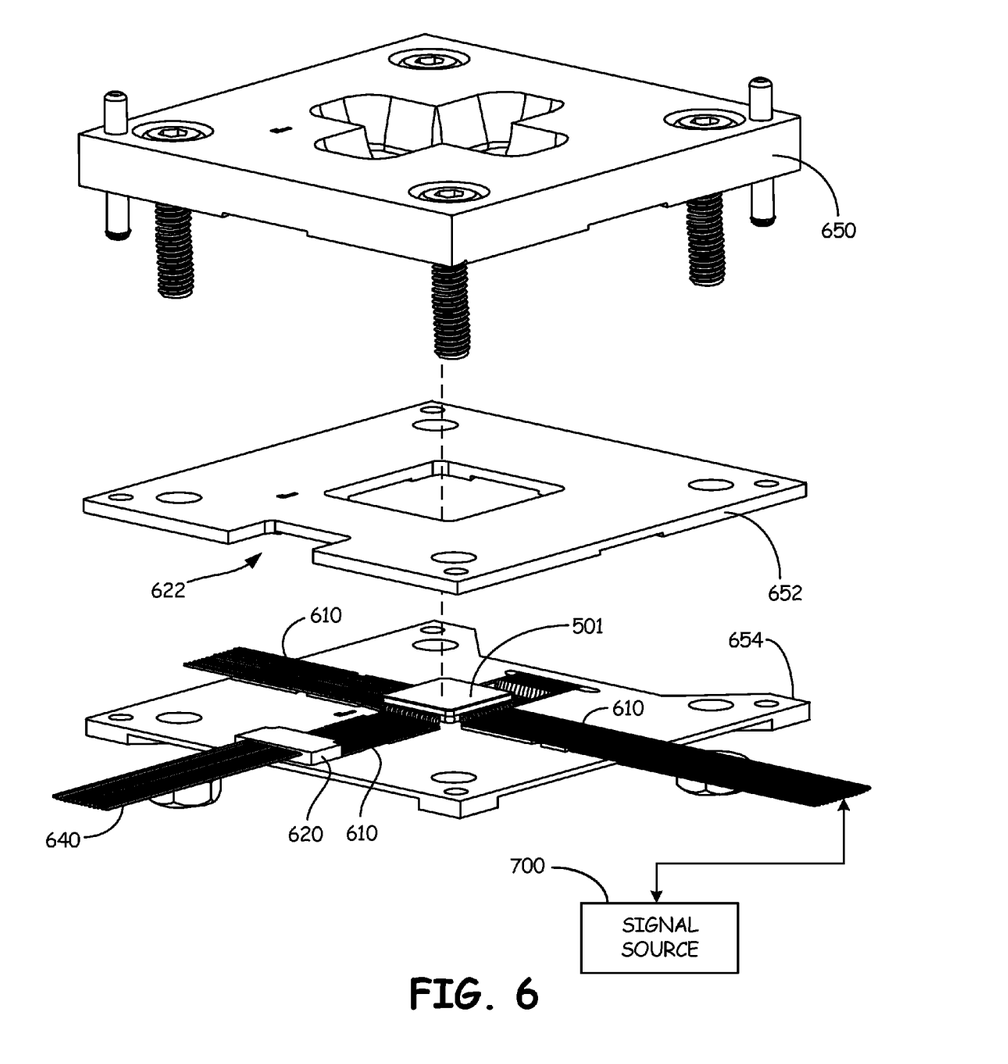
FIG. 6 is an exploded perspective view of a plurality of alternative load board complaint system.

FIGS. 6, 7 and 8 illustrate the various embodiments at once. The DUT 501 is received within the guide elements 652, 654. In one quadrant, the flex circuit 610 extends directly outwardly to a test signal source 700. In another quadrant, the flex circuit 610 terminates at block 620 and then a second flex circuit or ribbon cable 640 continues to the signal source.

To accommodate block 620, a portion 622 of the retainer is cut away (FIG. 7).

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

I claim:

1. A kelvin test device for testing a device under test (DUT) by temporarily connecting the DUT to a signal source via the test device connected to a load board, the load board having a peripheral edge, comprising:
   a. first and second temporary mechanical and electrical contacts between the DUT having a plurality of terminals, the first electrical contacts engaging the terminals at their proximal end and generally extending away from at least one terminal in a first direction to a load board at their distal ends for sending and receiving test signals from a signal source;
   b. said second contacts being kelvin test contacts and being in temporary mechanical and electrical contact with said DUT at their proximal ends and being generally extending away from at least one terminal in said first direction, parallel to and spaced apart from said first contacts and routed to said signal source beyond the peripheral edge of and without interconnection with said load board at their distal ends, including:
      a. a flex circuit having electrical traces and distal and proximal ends;
      b. a portion of said second contacts toward their distal ends overlying and in contact with said flex circuit at its proximal end;
      c. a connection block having a receiver for the distal end of said flex circuit and being wired to said signal source and bypassing said load board;
      d. the proximal end of the said flex circuit being electrically and mechanically connected to said connection block;
   whereby the kelvin contacts are connected to the signal source without passing through said load board.

2. The system of claim 1 wherein said flex circuit and said second contacts are maintained in electrical connection by a retainer plate affixed thereover and applying pressure thereto.

3. A retrofit kelvin test device for testing a device under test (DUT) by temporarily connecting the DUT to a signal source via the test device connected to a load board, the load board having a peripheral edge, said test device not previously configured to accommodate kelvin signals, comprising:
   a. first and second temporary mechanical and electrical contacts between the DUT having a plurality of terminals, the first electrical contacts engaging the terminals at their proximal end generally extending away from at least one terminal in a first direction and being routed to a load board at their distal ends;
   for sending and receiving test signals from a signal source;
   b. said second contacts being kelvin test contacts and being in temporary mechanical and electrical contact with said DUT at their proximal ends and generally extending away from at least one terminal in said first direction, parallel to and spaced apart from said first contacts and being routed to said signal source without interconnection with said load board at their distal ends, including:
      a. a flex circuit having electrical traces and distal and proximal ends;

b. a portion of said second contacts toward said distal ends overlying and in contact with said flex circuit at its proximal end;

c. a connection block having a receiver for the distal end of said flex circuit and being wired to said signal source;

d. the remaining end of the said flex circuit being electrically and mechanically connected to said connection block;

whereby the kelvin contacts are connected to the signal source and bypassing said load board.

4. A method of retrofitting a test system for testing a device under test (DUT), said test system being connected to a load board having a peripheral edge and lacking pads for kelvin contacts on the load board, the test system having non-kelvin and a kelvin test contacts with their proximal ends at the DUT and their distal ends extending away from the DUT, test signals being transmitted to said DUT from a test signal source via said contacts, comprising the steps of:

a. aligning said kelvin and non-kelvin contacts in pairs generally parallel to each other and extending the kelvin contacts longitudinally away from the DUT, b. physically and electrically bonding a flex circuit having traces corresponding to kelvin test contact to the kelvin contacts and proximate the distal end thereof, c. compressing overlapping portions of the flex circuit and kelvin contacts together to create an electrical connection and inserting the remaining end of the flex circuit into a contact block and, d. connecting an output of the contact block to a ribbon cable, e. connecting the ribbon cable to a test signal source, thereby retrofitting the test system to include kelvin capabilities.

5. The method of claim 4 wherein said flex circuit and said ribbon cable bypass the load board and have no electrical connection therewith.

6. The method of claim 4 wherein said flex circuit is connected to the test system on an otherwise vacant area of the load board.

7. The retrofit kit of claim 3 wherein said flex circuit and kelvin contacts are electrically connected where they overly each other by a removable retainer plate thereon which applies pressure to the flex circuit and kelvin contacts.

\* \* \* \* \*